(12) United States Patent
Gao (10) Patent No.: US 9,721,974 B2
(45) Date of Patent: Aug. 1, 2017

(54) ARRAY SUBSTRATE AND METHOD FOR MANUFACTURING THE SAME, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., SICHUAN (CN)

(72) Inventor: Shan Gao, Beijing (CN)

(73) Assignees: BOE TECHNOLOGY GROUP CO., LTD. (CN); CHENGDU BOE OPTOELECTRONICS TECHNOLOGY CO., LTD. (CN)

( * ) Notice: Subject to any disclaimer, the term of this patent is extended or adjusted under 35 U.S.C. 154(b) by 24 days.

(21) Appl. No.: 14/525,625

(22) Filed: Oct. 28, 2014

(65) Prior Publication Data

US 2015/0372014 A1 Dec. 24, 2015

(30) Foreign Application Priority Data

Jun. 18, 2014 (CN) .......................... 2014 1 0273389

(51) Int. Cl.
  *H01L 27/14* (2006.01)
  *H01L 27/12* (2006.01)
  (Continued)

(52) U.S. Cl.
  CPC ........ *H01L 27/124* (2013.01); *H01L 27/1244* (2013.01); *H01L 27/1259* (2013.01);
  (Continued)

(58) Field of Classification Search
  CPC .......................... H01L 27/124; H01L 27/1259
  See application file for complete search history.

(56) References Cited

U.S. PATENT DOCUMENTS

2001/0048109 A1* 12/2001 Murade ................ G02F 1/1345
  257/72
2011/0032460 A1* 2/2011 Lee .................... G02F 1/133555
  349/114

FOREIGN PATENT DOCUMENTS

| CN | 100422831 C | 10/2008 |
|----|-------------|---------|
| CN | 103713437 A | 4/2014 |
| KR | 10-2011-0039124 A | 4/2011 |

OTHER PUBLICATIONS

Office Action in Chinese Patent Application No. 201410273389.7, dated May 18, 2016.
(Continued)

*Primary Examiner* — Wael Fahmy
*Assistant Examiner* — Sarah Salerno
(74) *Attorney, Agent, or Firm* — Baker Hostetler LLP (57) ABSTRACT

The present invention relates to an array substrate, a method for manufacturing the same and a display device. The array substrate comprises a substrate, and a first region and a second region that are provided on the substrate and adjacent to each other and a difference in level between the two exceeds a threshold, a difference-in-level compensation pattern is provided on the substrate, which overlaps with both the first region and the second region in a direction perpendicular to the substrate and does not exceed the first region and the second region. By the technical solution of the present invention, the difference in level between the data line and an adjacent region on the array substrate is reduced, so that during a rubbing process, the rubbing area of a polyimide solution is increased, and the risk of light leakage is reduced without a decrease of the pixel aperture ratio.

7 Claims, 7 Drawing Sheets

(51) Int. Cl.
  *H01L 29/786* (2006.01)
  *H01L 29/423* (2006.01)
(52) U.S. Cl.
  CPC .... *H01L 27/1288* (2013.01); *H01L 29/42372* (2013.01); *H01L 29/42384* (2013.01); *H01L 29/78606* (2013.01); *H01L 29/78696* (2013.01)

(56) References Cited

OTHER PUBLICATIONS

Office Action in Chinese Patent Application No. 201410273389.7, dated Sep. 7, 2016.

* cited by examiner

ARRAY SUBSTRATE AND METHOD FOR MANUFACTURING THE SAME, AND DISPLAY DEVICE

CROSS REFERENCE TO RELATED APPLICATION

This application claims priority to Chinese Patent Application No. 201410273389.7 filed on Jun. 18, 2014, the disclosures of which are incorporated in their entirety by reference herein.

TECHNICAL FIELD

The present invention relates to the field of liquid crystal display, and in particular, to an array substrate and a method for manufacturing the same, and a display device.

BACKGROUND

As a prevailing wide-viewing angle technology of the thin film transistor liquid crystal display (TFT-LCD), plane electric field technology has the advantages of ultra-wide viewing angle, high aperture ratio and short response time, etc. In the current plane electric field technology, an array substrate is generally manufactured via a 6-time patterning process, and there are too many production processes, which causes a high cost for manufacturing the array substrate; in order to reduce the cost for manufacturing the array substrate, a half tone mask (HTM) or a single slit mask (SSM) could be employed for patterning at the position of a channel, thereby the pattern of an active layer and the pattern of a source-drain metal layer may be formed simultaneously via a one time patterning process, so that the array substrate may be manufactured via a 5-time patterning process, thereby the number of times of production processes may be reduced, and the production efficiency may be improved.

However, in the process in which an array substrate is manufactured via a 5-time patterning process, no separate patterning process is employed to manufacture the pattern of an active layer, the active layer exists under the whole source-drain metal layer except for the channel region; as a result, in the effective display region, the difference between the film height at a data line consisted by the source-drain metal layer and the film height of an adjacent region is large, thus during a rubbing process (at present, it generally employs polyimide solution rubbing to make the liquid crystal molecules be arranged orderly), the regions in the vicinity of the data line on the array substrate are difficult to be rubbed, so that the liquid crystal arrangement in the regions in the vicinity of the data line will be disordered, and light leakage will occur once the region is not covered by a black matrix (BM); however, if a BM is provided to cover this region, the aperture ratio of the pixel will be reduced.

SUMMARY

The technical problem to be solved by the present invention is to provide an array substrate and a method for manufacturing the same, and a display device, thereby the difference in level between the data line and an adjacent region on an array substrate can be reduced, so that during a rubbing process, the rubbing range of a polyimide solution can be increased, and the risk of light leakage can be reduced without a decrease of the pixel aperture ratio.

To solve the above technical problem, the embodiments of the present invention provide the following technical solutions:

On one hand, the present invention provides an array substrate, which includes: a substrate, and a first region and a second region that are provided on the substrate and adjacent to each other, a difference in level between the first region and the second region exceeds a threshold, wherein a difference-in-level compensation pattern is provided on the substrate, and the difference-in-level compensation pattern overlaps with both the first region and the second region in a direction perpendicular to the substrate, and the difference-in-level compensation pattern does not exceed the first region and the second region.

According to one embodiment of the present invention, the first region is a region that a data line is located, and the difference-in-level compensation pattern extends along the data line in a direction parallel to the substrate.

According to one embodiment of the present invention, the difference-in-level compensation pattern is formed by a gate metal layer.

According to one embodiment of the present invention, the array substrate includes:
a substrate; a gate electrode, a gate line and the difference-in-level compensation pattern that are formed by a gate metal layer and provided on the substrate; a gate insulating layer provided on the gate electrode, the gate line and the difference-in-level compensation pattern; a pattern of an active layer and a pixel electrode that are provided on the gate insulating layer; a source electrode, a drain electrode and the data line that are formed by a source-drain metal layer and provided on the pattern of the active layer; a passivation layer provided on the pixel electrode, the source electrode, the drain electrode and the data line; a common electrode provided on the passivation layer; and an orientation layer provided on the common electrode.

According to one embodiment of the present invention, the difference-in-level compensation pattern is formed by an active layer.

According to one embodiment of the present invention, the array substrate includes:
a substrate; a gate electrode and a gate line that are formed by a gate metal layer and provided on the substrate; a gate insulating layer provided on the gate electrode and the gate line; a pattern of an active layer, the difference-in-level compensation pattern formed by the active layer and a pixel electrode that are provided on the gate insulating layer; a source electrode, a drain electrode and the data line that are formed by a source-drain metal layer and provided on the pattern of the active layer and the difference-in-level compensation pattern; a passivation layer provided on the pixel electrode, the source electrode, the drain electrode and the data line; a common electrode provided on the passivation layer; and an orientation layer provided on the common electrode.

The present invention further provides a display device, which includes the above array substrate.

The present invention further provides a method for manufacturing an array substrate, the array substrate includes a substrate, and a first region and a second region that are provided on the substrate and adjacent to each other, a difference in level between the first region and the second region exceeds a threshold, the method includes:
forming a difference-in-level compensation pattern on the substrate, wherein the difference-in-level compensation pattern overlaps with both the first region and the second region in a direction perpendicular to the substrate, and the difference-in-level compensation pattern does not exceed the first region and the second region.

According to one embodiment of the present invention, the first region is a region in which a data line exists, and forming a difference-in-level compensation pattern on the substrate includes: forming the difference-in-level compensation pattern on the substrate, wherein the difference-in-level compensation pattern extends along the data line in a direction parallel to the substrate.

According to one embodiment of the present invention, forming a difference-in-level compensation pattern on the substrate includes: forming a gate electrode, a gate line and the difference-in-level compensation pattern by a gate metal layer via a one-time patterning process.

According to one embodiment of the present invention, wherein forming a difference-in-level compensation pattern on the substrate includes: forming the pattern of an active layer and the difference-in-level compensation pattern by an active layer via a one-time patterning process.

The embodiments of the present invention have the following beneficial effects:

In the above solution, the difference in level between the adjacent first region and second region on the substrate exceeds a threshold, and a difference-in-level compensation pattern is provided on the substrate, the difference-in-level compensation pattern overlaps with both the first region and the second region in a direction perpendicular to the substrate, and the difference-in-level compensation pattern does not exceed the first region and the second region, thus a stepped structure can be formed at the juncture of the first region and the second region, the difference in level between the first region and the second region on the array substrate can be reduced, so that the difference in level in the region covered by polyimide solution can be reduced, and during a rubbing process, the rubbing range of a polyimide solution can be increased, and the risk of light leakage can be reduced without a decrease of the pixel aperture ratio.

REFERENCE MARKS

10 Gate Metal Layer
11 Gate Insulating Layer
12 Active Layer
13 Source-Drain Metal Layer
14 Pixel Electrode
15 Passivation Layer
16 Common Electrode
17 Orientation layer
18 Half Tone Mask
19 Photoresist
20 Difference-in-level compensation pattern

DETAILED DESCRIPTION

In order to make the technical problems to be solved, the technical solutions and the advantages of the embodiments of the present invention more apparent, detailed description will be given below in conjunction with the drawings and specific embodiments.

Considering the problems of the prior art that the difference between the film height at a data line formed by the source-drain metal layer and the film height of an adjacent region is large, thus the regions in the vicinity of the data line on the array substrate is difficult to be rubbed during a rubbing process, thereby the liquid crystal arrangement in the regions in the vicinity of the data line will be disordered, the embodiments of the present invention provide an array substrate and a method for manufacturing the same, and display device, thereby the difference in level between the data line and an adjacent region on an array substrate can be reduced, so that during a rubbing process, the rubbing range of a polyimide solution can be increased, and the risk of light leakage can be reduced without a decrease of the pixel aperture ratio.

One embodiment of the present invention provides an array substrate, which includes a substrate, and a first region and a second region that are provided on the substrate and adjacent to each other, the difference in level between the first region and the second region exceeds a threshold, wherein a difference-in-level compensation pattern is provided on the substrate, the difference-in-level compensation pattern overlaps with both the first region and the second region in a direction perpendicular to the substrate, and the difference-in-level compensation pattern does not exceed the first region and the second region.

In the present invention, the difference in level between the adjacent first region and second region on the substrate exceeds a threshold, and a difference-in-level compensation pattern is provided on the substrate, the difference-in-level compensation pattern overlaps with both the first region and the second region in a direction perpendicular to the substrate, and the difference-in-level compensation pattern does not exceed the first region and the second region, thus a stepped structure can be formed at the juncture of the first region and the second region, and the difference in level between the first region and the second region on the array substrate can be reduced, so that the difference in level in the region covered by polyimide solution can be reduced, and during a rubbing process, the rubbing range of a polyimide solution can be increased, and the risk of light leakage can be reduced without a decrease of the pixel aperture ratio.

In one embodiment of the present invention, the first region is a region in which a data line exists, and the difference-in-level compensation pattern extends along the data line in a direction parallel to the substrate.

In one embodiment of the present invention, the difference-in-level compensation pattern is formed by a gate metal layer.

In one embodiment of the present invention, the array substrate may include:

a substrate;

a gate electrode, a gate line and the difference-in-level compensation pattern that are formed by a gate metal layer and provided on the substrate;

a gate insulating layer provided on the gate electrode, the gate line and the difference-in-level compensation pattern;

a pattern of an active layer and a pixel electrode provided on the gate insulating layer;

a source electrode, a drain electrode and the data line that are formed by a source-drain metal layer and provided on the pattern of the active layer;

a passivation layer provided on the pixel electrode, the source electrode, the drain electrode and the data line;

a common electrode provided on the passivation layer; and an orientation layer provided on the common electrode.

In one embodiment of the present invention, the difference-in-level compensation pattern is formed by an active layer.

In one embodiment of the present invention, the array substrate may include:

a substrate;

a gate electrode and a gate line that are formed by a gate metal layer and provided on the substrate;

a gate insulating layer provided on the gate electrode and the gate line;

the pattern of an active layer, the difference-in-level compensation pattern formed by the active layer and the pixel electrode that are provided on the gate insulating layer;

a source electrode, a drain electrode and the data line that are formed by a source-drain metal layer and provided on the pattern of an active layer and the difference-in-level compensation pattern;

a passivation layer provided on the pixel electrode, the source electrode, the drain electrode and the data line;

a common electrode provided on the passivation layer; and an orientation layer provided on the common electrode.

One embodiment of the present invention further provides a method for manufacturing an array substrate, wherein the array substrate includes a substrate, and a first region and a second region that are provided on the substrate and adjacent to each other, and the difference in level between the first region and the second region exceeds a threshold, wherein the manufacturing method includes:

forming a difference-in-level compensation pattern on the substrate, wherein the difference-in-level compensation pattern overlaps with both the first region and the second region in a direction perpendicular to the substrate, and the difference-in-level compensation pattern does not exceed the first region and the second region.

The difference in level between the adjacent first region and second region on the array substrate manufactured by the present invention exceeds a threshold, and a difference-in-level compensation pattern is provided on the substrate, the difference-in-level compensation pattern overlaps with both the first region and the second region in a direction perpendicular to the substrate, and the difference-in-level compensation pattern does not exceed the first region and the second region, by doing this, a stepped structure can be formed at the juncture of the first region and the second region, and the difference in level between the first region and the second region on the array substrate can be reduced, so that the difference in level in the region covered by polyimide solution can be reduced, and during a rubbing process, the rubbing range of a polyimide solution can be increased, and the risk of light leakage can be reduced without a decrease of the pixel aperture ratio.

In one embodiment of the present invention, the first region is a region in which a data line exists, and forming a difference-in-level compensation pattern on the substrate includes:

forming the difference-in-level compensation pattern on the substrate, wherein the difference-in-level compensation pattern extends along the data line in a direction parallel to the substrate.

In one embodiment of the present invention, forming a difference-in-level compensation pattern on the substrate includes:

forming a gate electrode, a gate line and the difference-hi-level compensation pattern by a gate metal layer via a one-time patterning process.

In one embodiment of the present invention, forming a difference-in-level compensation pattern on the substrate includes:

forming the pattern of an active layer and the difference-in-level compensation pattern by an active layer via a one-time patterning process.

One embodiment of the present invention further provides a display device, which includes the above array substrate. The structure of the array substrate is the same as that in the above embodiment, and no further description will be given again here. Additionally, reference may be made to the prior art for the structures of other parts of the display device, and no detailed description will be given again here. The display device may be any product or component that has a display function, for example, a liquid crystal panel, an electronic paper, a liquid crystal TV set, a liquid crystal display, a digital photo frame, a mobile phone or a tablet computer, etc.

An array substrate according to the present invention and a method for manufacturing the same will be introduced in detail below in conjunction with the drawings and specific embodiments, by taking the case that the first region is a region in which a data line exists as an example.

Figure 1:
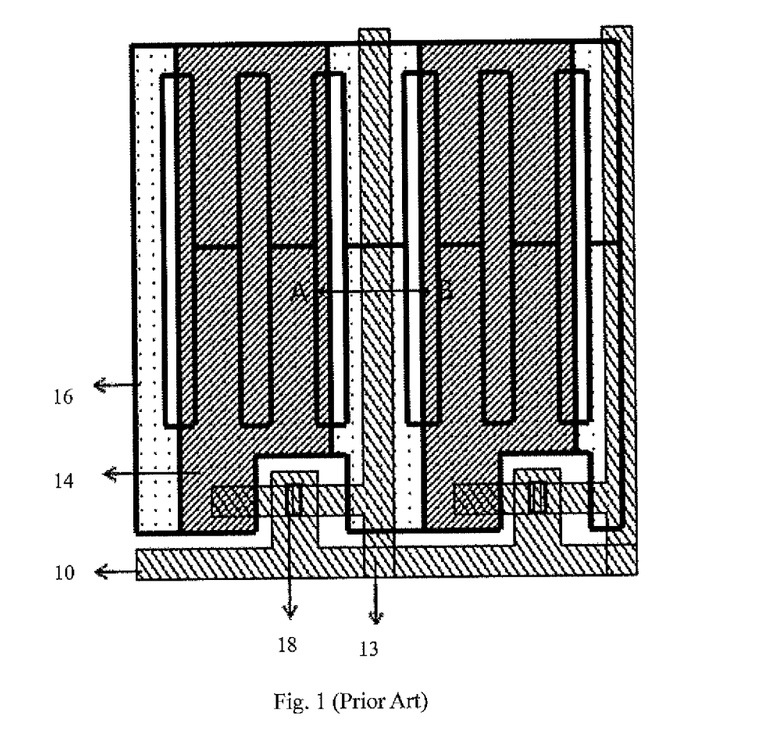
FIG. 1 is a schematic plan view of an existing array substrate.
Figure 2:
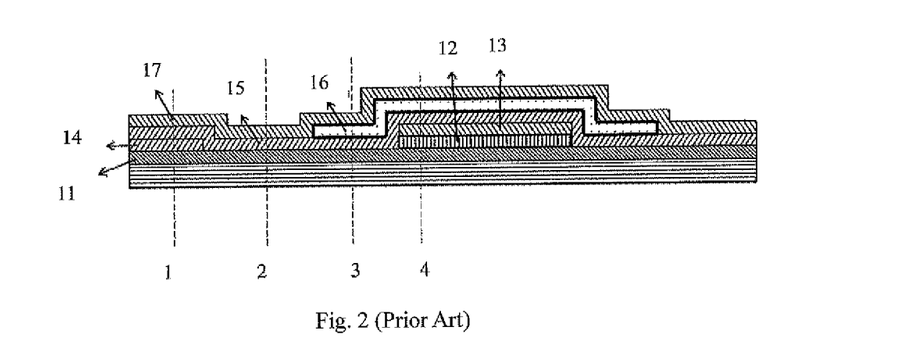
FIG. 2 is an A-B sectional view of the array substrate shown in FIG. 1.
Figure 3:
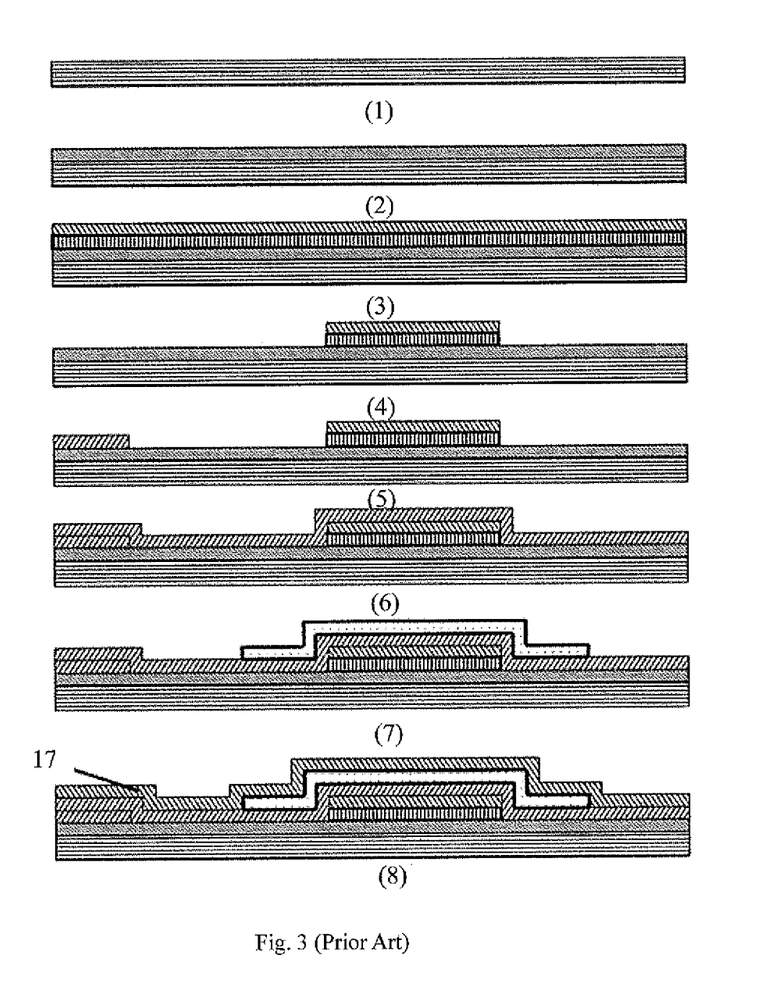
FIG. 3 is a schematic flow chart of an existing method for manufacturing an array substrate.

FIG. 1 is a schematic plan view of an array substrate manufactured via a 5-time patterning process in the prior art; FIG. 2 is an A-B sectional view of the array substrate shown in FIG. 1; and FIG. 3 is a schematic flow chart showing a process of manufacturing an array substrate via a 5-time patterning process in the prior art. As shown in FIG. 3, the existing method for manufacturing an array substrate includes the steps of: (1) providing a substrate, and forming a gate line and a gate electrode on the substrate (not shown); (2) depositing a gate insulating layer on the substrate; (3) depositing an active layer and a source-drain metal layer on the substrate; (4) patterning via a half tone mask, to form a channel pattern, a source electrode and a drain electrode; (5) forming a pixel electrode on the substrate; (6) depositing a passivation layer on the substrate; (7) forming a common electrode on the substrate; and (8) forming an orientation layer on the substrate. The patterning process includes: film coating→Photo Resist (PR) coating→exposing via a Mask→developing→etching→peeling off PR, etc.

In the existing process in which an array substrate is manufactured via a 5-time patterning process, no separate patterning process is employed to manufacture the pattern of an active layer, thus the active layer exists under the whole source-drain metal layer except for the channel region, as shown in FIG. 2, and in the effective display region, the active layer exists under the data line formed by a source-drain metal layer, and the overlapping of the data line and the active layer causes that the difference between the film height at the data line and the film height of an adjacent region is large; for the number of films covered by the orientation layer (i.e., polyimide solution), the number of films at positions 1, 2, 3 and 4 in FIG. 2 is 4, 3, 4 and 6 in sequence respectively, and it may be seen that at the edge of the data line, i.e., at positions 3 and 4, the number of films jumps directly from 4 to 6, such a difference in level will cause that, during a rubbing process, it is difficult to thoroughly rub the polyimide solution in the vicinity of the edge of data line, thus the arrangement of liquid crystal will be disordered, that is, an initial arrangement direction of the liquid crystal molecule will be uncontrollable, and when an electric field exists, the risk of light leakage may appear once it is not covered by the BM. However, if the width of the BM is increased, the aperture ratio of the pixel will be reduced. In recent years, a Photo Alignment technology arises, and the liquid crystal molecules may be arranged orderly without employing the polyimide solution rubbing process. Theoretically, the above risk of light leakage may be solved by this technology; however, the processes of this technology are fuzzy, the equipment in the existing process needs to be reconstructed, and other defects such as Image Sticking, etc., may be caused.

To solve the above problem, in the array substrate according to the present invention, a difference-in-level compensation pattern is provided on the substrate, and the difference-in-level compensation pattern overlaps with the data line and the data line in a direction perpendicular to the substrate, thus a stepped structure may be formed at the edge of the data line, and the difference in level between the regions covered by the orientation layer may be reduced, so that during a rubbing process, the rubbing range of a polyimide solution can be increased, and the risk of light leakage can be reduced without a decrease of the pixel aperture ratio.

Embodiment 1

In this embodiment, a difference-in-level compensation pattern is formed by a gate metal layer, moreover, a gate electrode, a gate line and the difference-in-level compensation pattern are formed simultaneously via a one-time patterning process.

Figure 4:
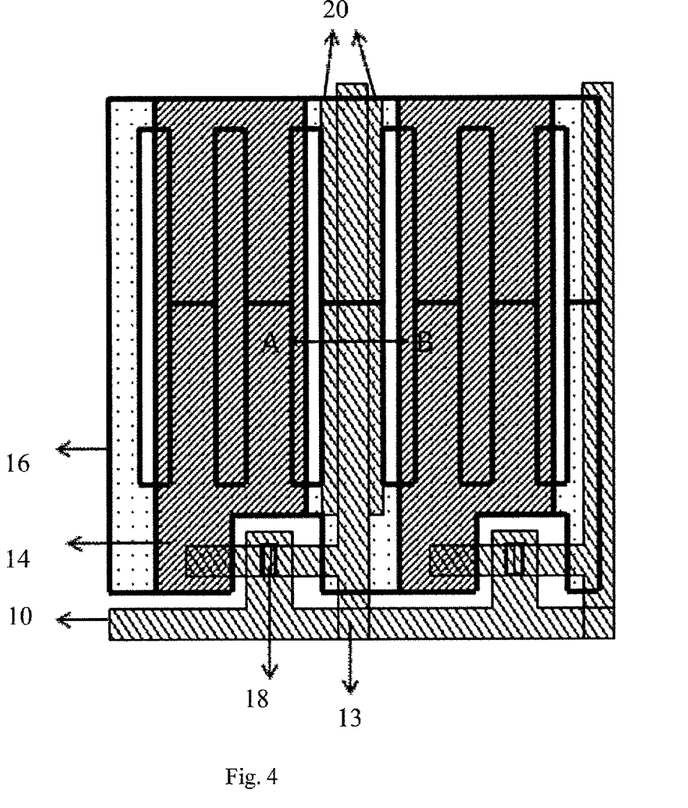
FIG. 4 is a schematic plan view of an array substrate according to Embodiment 1 of the present invention.
Figure 5:
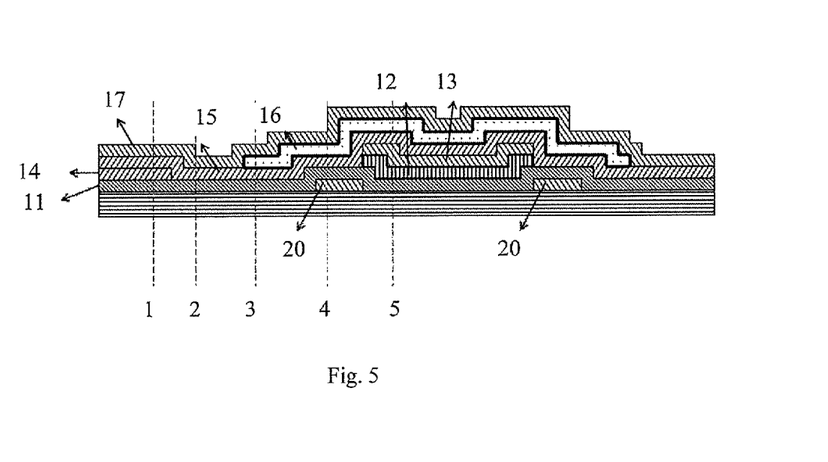
FIG. 5 is an A-B sectional view of the array substrate shown in FIG. 4.

FIG. 4 is a schematic plan view of an array substrate according to this embodiment, and FIG. 5 is an A-B sectional view of the array substrate shown in FIG. 4. It may be seen from FIG. 4 and FIG. 5 that a difference-in-level compensation pattern formed by a gate metal layer is provided under the edge of the data line, the number of films under the orientation layer 17 at positions 1, 2, 3, 4 and 5 in FIG. 5 are 4, 3, 4, 5, 6 in sequence respectively; and it may be seen that, the existence of the difference-in-level compensation pattern makes the difference in level of the film unlike that in FIG. 2, which jumps directly from 4 to 6, instead, a stepped structure is formed at the edge of the data line, wherein the difference-in-level compensation pattern is formed together with the gate electrode and the gate line, but it does not functions as a gate electrode or a gate line.

Figure 6:
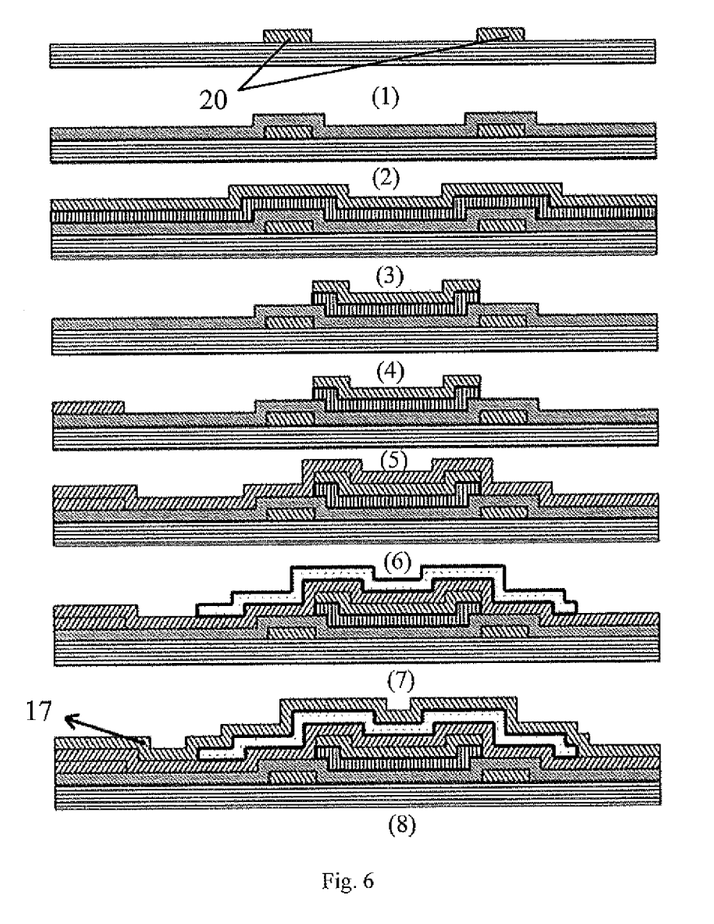
FIG. 6 is a schematic flow chart of a method for manufacturing an array substrate according to Embodiment 1 of the present invention.

FIG. 6 is a schematic flow chart of a method for manufacturing an array substrate according to this embodiment. As shown in FIG. 6, the method for manufacturing an array substrate according to this embodiment includes the steps as follows.

Step a1: as shown in FIG. 6(1), a substrate is provided, wherein the substrate may be a glass substrate or a quartz substrate. In one embodiment, a gate metal layer may be deposited on the substrate via sputtering or heat evaporation, and the material of the gate metal layer may be a metal such as Cu, Mo, Cr, Nd, Ni, Mn, Ti and W, etc., or an alloy thereof, the gate metal layer may have a single-layer structure or a multi-layer structure, wherein the multi-layer structure may be, for example, Cu\Mo, Ti\Cu\Ti, etc. A layer of photoresist is coated on the gate metal layer, and the photoresist is exposed via a mask to form a photoresist-removed region and a photoresist-reserved region, wherein the photoresist-reserved region corresponds to the region in which the gate electrode, the gate line and the difference-in-level compensation pattern exist, and the photoresist-removed region corresponds to the region except for the above patterns; a developing process is performed, so that the photoresist in the photoresist-removed region is completely removed, and the thickness of the photoresist in the photoresist-reserved region keeps unchanged; the gate metal film in the photoresist-removed region is completely etched off via an etching process, and the remaining photoresist is peeled off, so as to form a gate electrode, a gate line and a difference-in-level compensation pattern 20, wherein the difference-in-level compensation pattern 20 is provided right under the data line, and the projection of the edge of the data line in a direction perpendicular to the substrate may fall into the difference-in-level compensation pattern 20, or the projection of the whole data line in a direction perpendicular to the substrate may fall into the difference-in-level compensation pattern 20.

Step a2: as shown in FIG. 6 (2), a gate insulating layer is formed on the substrate. In one embodiment, a gate insulating layer may be deposited on the substrate, on which Step a1 is accomplished, via plasma-enhanced chemical vapor deposition (PECVD), wherein the material of the gate insulating layer may be an oxide, a nitride or a nitrogen oxide, and the gate insulating layer may have a single-layer structure, a double-layer structure or a multi-layer structure. In one embodiment, the material of the gate insulating layer may be SiNx, SiOx or Si(ON)x.

Step a3: as shown in FIG. 6 (3), an active layer and a source-drain metal layer are deposited on the substrate in sequence. In one embodiment, a semiconductor layer may be deposited on the substrate, on which Step a2 is accomplished, via magnetron sputtering, heat evaporation or other film-forming methods, and then a source-drain metal layer may be deposited via magnetron sputtering, heat evaporation or other film-forming methods, wherein the material of the source-drain metal layer may be a metal such as Cu, Mo, Cr, Nd, Ni, Mn, Ti and W, etc., or an alloy thereof. The source-drain metal layer may have a single-layer structure or a multi-layer structure, wherein the multi-layer structure may be, for example, Cu\Mo and Ti\Cu\Ti, etc.

Step a4: as shown in FIG. 6 (4), in one embodiment, a layer of photoresist is coated on the source-drain metal layer, and the photoresist is exposed via a half tone mask, so as to form a channel pattern, a data line, a source electrode and a drain electrode, wherein the active layer is reserved under the data line. The projection of the edge of the data line in a direction perpendicular to the substrate fall into the difference-in-level compensation pattern 20, and a stepped structure may be formed at the edge of the data line by employing the difference-in-level compensation pattern 20.

Step a5: as shown in FIG. 6 (5), a transparent conductive layer is deposited on the substrate, on which Step a4 is accomplished, via magnetron sputtering, heat evaporation or other film-forming methods, and the material of the transparent conductive layer may be ITO or IZO. A layer of photoresist is coated on the transparent conductive layer; the photoresist is exposed via a mask to form a photoresist-removed region and a photoresist-reserved region, wherein the photoresist-reserved region corresponds to the pattern of the pixel electrode, and the photoresist-removed region corresponds to the region except for the above patterns; a developing process is performed, the photoresist in the photoresist-removed region is completely removed, and the thickness of the photoresist in the photoresist-reserved region keeps unchanged; the transparent conductive layer in the photoresist-removed region is completely etched off via an etching process, and the remaining photoresist is peeled off, so as to form a pixel electrode.

Step a6: as shown in FIG. 6 (6), a layer of passivation layer material is deposited on the substrate, on which Step a5 is accomplished, via magnetron sputtering, heat evaporation, PECVD or other film-forming methods, wherein the material of the passivation layer material may be an oxide, a nitride or a nitrogen oxide, in one embodiment, the material of the passivation layer may be SiNx, SiOx or Si(ON)x. The passivation layer may have a single-layer structure, or a double-layer structure consisted of silicon nitride and silicon oxide.

Step a7: as shown in FIG. 6 (7), a transparent conductive layer is deposited on the substrate, on which Step a6 is accomplished, via magnetron sputtering, heat evaporation or other film-forming methods, and the material of the transparent conductive layer may be ITO or IZO. A layer of photoresist is coated on the transparent conductive layer; and the photoresist is exposed via a mask so as to form a photoresist-removed region and a photoresist-reserved region, wherein the photoresist-reserved region corresponds to the pattern of the common electrode, and the photoresist-removed region corresponds to the region except for the above patterns; a developing process is performed, the photoresist in the photoresist-removed region is completely removed, and the thickness of the photoresist in the photoresist-reserved region remains unchanged; the transparent conductive layer in the photoresist-removed region is completely etched off via an etching process, the remaining photoresist is peeled off, so as to form a common electrode, and the liquid crystal molecules are driven to rotate by an electric field between the common electrode and the pixel electrode.

Step a8: as shown in FIG. 6 (8), a layer of polyimide (PI) solution is deposited on the substrate, on which Step a7 is accomplished, to form an orientation layer 17.

In this embodiment, a difference-in-level compensation pattern is formed on an substrate by a gate metal layer, and the projection of the edge of the data line in a direction perpendicular to the substrate completely falls into the difference-in-level compensation pattern, thus a stepped structure can be formed at the edge of the data line on the array substrate, and the difference in level between the data line and an adjacent region on an array substrate can be reduced, so that the difference in level in the region covered by polyimide solution can be reduced, and during a rubbing process, the rubbing range of a polyimide solution can be increased, and the risk of light leakage can be reduced without a decrease of the pixel aperture ratio.

Embodiment 2

In this embodiment, an active layer is employed to form a difference-in-level compensation pattern, and the pattern of an active layer and a difference-in-level compensation pattern are formed simultaneously via a one-time patterning process.

Figure 7:
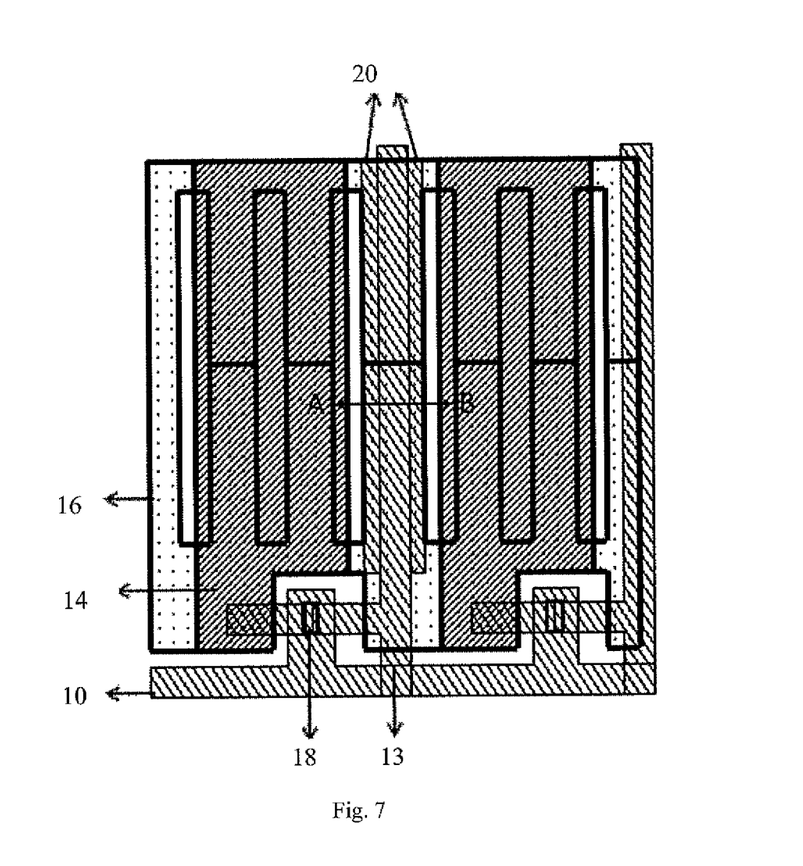
FIG. 7 is a schematic plan view of an array substrate according to Embodiment 2 of the present invention.
Figure 8:
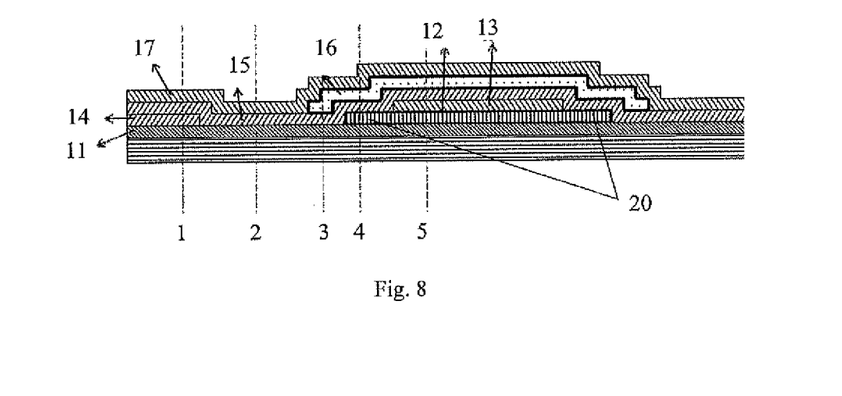
FIG. 8 is an A-B sectional view of the array substrate shown in FIG. 7.

FIG. 7 is a schematic plan view of an array substrate according to this embodiment, and FIG. 8 is an A-B sectional view of the array substrate shown in FIG. 7. It may be seen from FIG. 7 and FIG. 8 that, a difference-in-level compensation pattern formed by an active layer is provided under the edge of the data line, and the number of films under the orientation layer 17 at positions 1, 2, 3, 4 and 5 in FIG. 8 is 4, 3, 4, 5 and 6 in sequence respectively; and it may be seen that, the existence of the difference-in-level compensation pattern makes the difference in level of the film unlike that of FIG. 2, which jumps directly from 4 to 6, instead, a stepped structure is formed at the edge of the data line.

Figure 9:
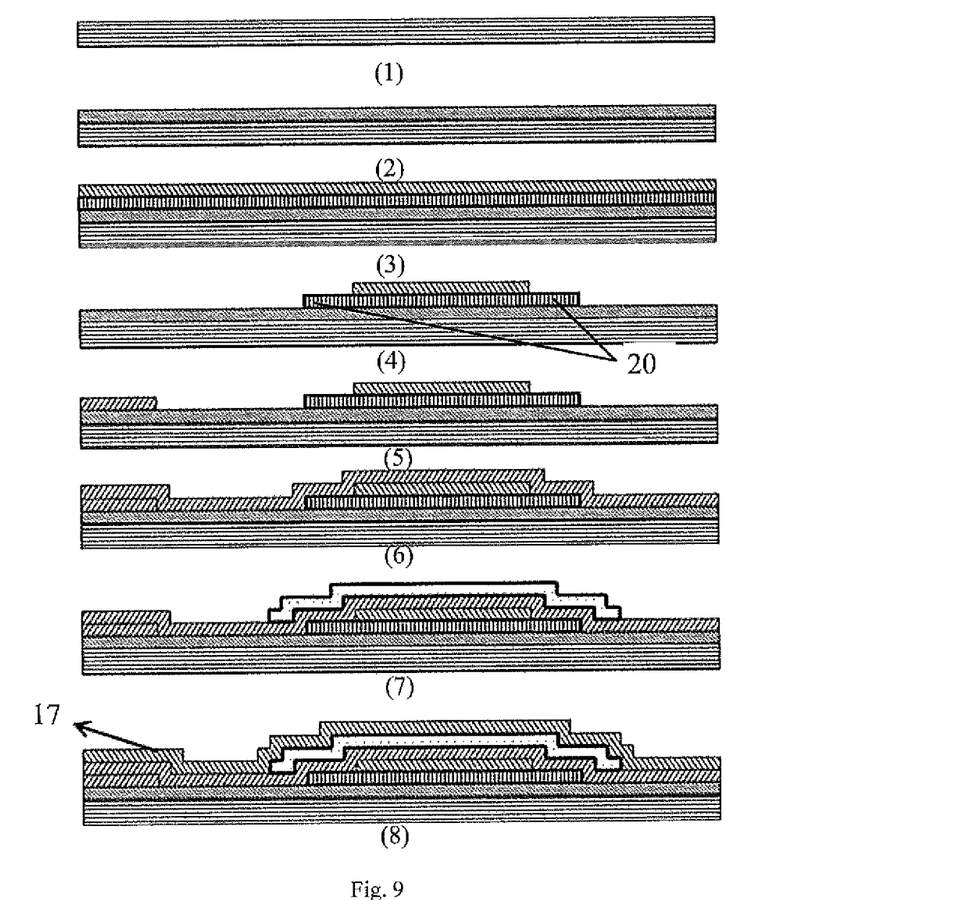
FIG. 9 is a schematic flow chart of a method for manufacturing an array substrate according to Embodiment 2 of the present invention.

FIG. 9 is a schematic flow chart of a method for manufacturing an array substrate according to this embodiment. As shown in FIG. 9, the method for manufacturing an array substrate according to this embodiment includes the steps as follows.

Step b1: as shown in FIG. 9 (1), a substrate is provided, wherein the substrate may be a glass substrate or a quartz substrate. In one embodiment, a gate metal layer may be deposited on the substrate via sputtering or heat evaporation, and the material of the gate metal layer may be a metal such as Cu, Mo, Cr, Nd, Ni, Mn, Ti and W, etc., or an alloy thereof, and the gate metal layer may have a single-layer structure or a multi-layer structure, wherein the multi-layer structure may be, for example, Cu\Mo, Ti\Cu\Ti, etc. A layer of photoresist is coated on the gate metal layer, and the photoresist is exposed via a mask to form a photoresist-removed region and a photoresist-reserved region, wherein the photoresist-reserved region corresponds to the region in which the gate electrode and the gate line exist, and the photoresist-removed region corresponds to the region except for the above patterns; a developing process is performed, the photoresist in the photoresist-removed region is completely removed, and the thickness of the photoresist in the photoresist-reserved region remains unchanged; the gate metal film in the photoresist-removed region is completely etched off via an etching process, and the remaining photoresist is peeled off, so as to form a gate electrode and a gate line.

Step b2: as shown in FIG. 9 (2), a gate insulating layer is formed on the substrate. In one embodiment, a gate insulating layer may be deposited on the substrate, on which Step b1 is accomplished, via plasma-enhanced chemical vapor deposition (PECVD), wherein the material of the gate insulating layer may be an oxide, a nitride or a nitrogen oxide, and the gate insulating layer may have a single-layer structure, a double-layer structure or a multi-layer structure. In one embodiment, the material of the gate insulating layer may be SiNx, SiOx or Si(ON)x.

Step b3: as shown in FIG. 9 (3), an active layer and a source-drain metal layer are deposited on the substrate in sequence. In one embodiment, a semiconductor layer may be deposited on the substrate, on which Step b2 is accomplished, via magnetron sputtering, heat evaporation or other film-forming methods, and then a source-drain metal layer may be deposited via magnetron sputtering, heat evaporation or other film-forming methods, wherein the material of the source-drain metal layer may be a metal such as Cu, Mo, Cr, Nd, Ni, Mn, Ti and W, etc., or an alloy thereof. The source-drain metal layer may have a single-layer structure or a multi-layer structure, wherein the multi-layer structure may be, for example, Cu\Mo and Ti\Cu\Ti, etc.

Step b4: as shown in FIG. 9 (4), in one embodiment, a layer of photoresist is coated on the source-drain metal layer, and the photoresist is exposed via a half tone mask to form a channel pattern, a data line, a source electrode and a drain electrode, wherein not only the active layer, but also a difference-in-level compensation pattern 20 formed by an active layer is reserved under the data line, and the projection of the data line in a direction perpendicular to the substrate falls into the difference-in-level compensation pattern 20, and a stepped structure may be formed at the edge of the data line via the difference-in-level compensation pattern 20.

Figure 10:
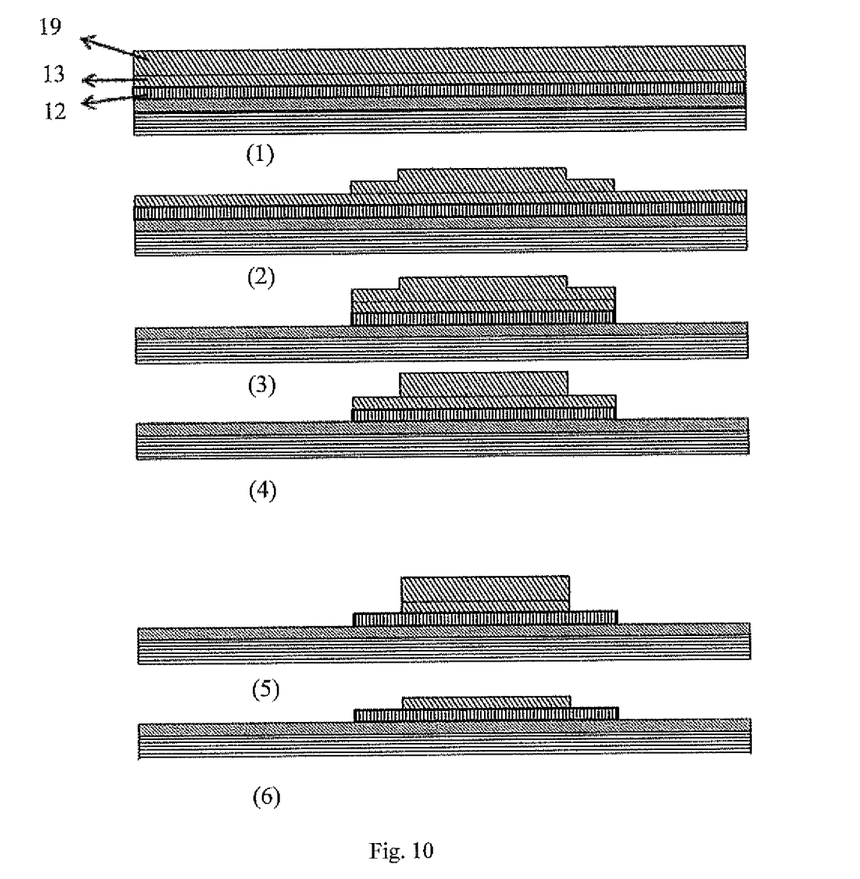
FIG. 10 is a schematic flow chart showing the process of forming a difference-in-level compensation pattern by an active layer according to Embodiment 2 of the present invention.

In the existing process, a channel pattern, a source electrode and a drain electrode are formed via a half tone mask. In comparison with the existing process, in this embodiment, the half tone mask is further needed in forming a data line. FIG. 10 is a schematic flow chart showing a process of forming a difference-in-level compensation pattern by an active layer according to this embodiment. As shown in FIG. 10, the process of forming a difference-in-level compensation pattern by an active layer mainly includes the steps of:

(1): As shown in FIG. 10 (1), a layer of photoresist 19 is coated on an active layer 12 and a source-drain metal layer 13;

(2): As shown in FIG. 10 (2), the photoresist is exposed via a mask to form a photoresist-removed region, a photoresist partially-reserved region and a photoresist completely-reserved region, wherein the photoresist partially-reserved region corresponds to the region in which the difference-in-level compensation pattern exists, the photoresist completely-reserved region corresponds to the region in which a data line exists, and the photoresist-removed region corresponds to the region except for the above patterns; a developing process is performed, and the photoresist in the photoresist-removed region is completely removed, the thickness of the photoresist in the photoresist completely-reserved region remains unchanged, and a thin layer of photoresist is reserved in the photoresist partially-reserved region;

(3) As shown in FIG. 10 (3), the source-drain metal layer and the active layer in the photoresist-removed region are completely etched off via an etching process;

(4) As shown in FIG. 10 (4), the photoresist in the photoresist partially-reserved region is ashed off;

(5) As shown in FIG. 10 (5), the source-drain metal layer in the photoresist partially-reserved region is completely etched off via an etching process;

(6) As shown in FIG. 10 (6), the photoresist in the photoresist completely-reserved region is peeled off, so as to form a data line.

It may be seen that, in addition to the channel region, the region in which a stepped structure needs to be formed is also exposed via a half tone mask, and the stepped structure required is formed via a two-time etching process.

Step b5: as shown in FIG. 9 (5), a transparent conductive layer is deposited on the substrate, on which Step b4 is accomplished, via magnetron sputtering, heat evaporation or other film-forming methods, and the material of the transparent conductive layer may be ITO or IZO. A layer of photoresist is coated on the transparent conductive layer; and the photoresist is exposed via a mask to form a photoresist-removed region and a photoresist-reserved region, wherein the photoresist-reserved region corresponds to the pattern of the pixel electrode, and the photoresist-removed region corresponds to the region except for the above patterns; a developing process is performed, the photoresist in the photoresist-removed region is completely removed, and the thickness of the photoresist in the photoresist-reserved region remains unchanged; the transparent conductive layer in the photoresist-removed region is completely etched off via an etching process, and the remaining photoresist is peeled off, so as to form a pixel electrode.

Step b6: as shown in FIG. 9 (6), a layer of passivation layer material is deposited on the substrate, on which Step b5 is accomplished, via magnetron sputtering, heat evaporation, PECVD or other film-forming methods, wherein the material of the passivation layer material may be an oxide, a nitride or a nitrogen oxide, in one embodiment, the material of the passivation layer may be SiNx, SiOx or Si(ON)x. The passivation layer may have a single-layer structure, or a double-layer structure consisted of silicon nitride and silicon oxide.

Step b7: as shown in FIG. 9 (7), a transparent conductive layer is deposited on the substrate, on which Step b6 is accomplished, via magnetron sputtering, heat evaporation or other film-forming methods, and the material of the transparent conductive layer may be ITO or IZO. A layer of photoresist is coated on the transparent conductive layer; and the photoresist is exposed via a mask to form a photoresist-removed region and a photoresist-reserved region, wherein the photoresist-reserved region corresponds to the pattern of the common electrode, and the photoresist-removed region corresponds to the region except for the above patterns; a developing process is performed, the photoresist in the photoresist-removed region is completely removed, and the thickness of the photoresist in the photoresist-reserved region remains unchanged; the transparent conductive layer in the photoresist-removed region is completely etched off via an etching process, the remaining photoresist is peeled off, so as to form a common electrode, and the liquid crystal molecules are driven to rotate by an electric field between the common electrode and the pixel electrode.

Step b8: as shown in FIG. 9 (8), a layer of polyimide (PI) solution is deposited on the substrate, on which Step b7 is accomplished, so as to form an orientation layer 17.

In this embodiment, a difference-in-level compensation pattern is formed on an substrate by an active layer, and the projection of the data line in a direction perpendicular to the substrate completely falls into the difference-in-level compensation pattern, thus a stepped structure can be formed at the edge of the data line on the array substrate, the difference in level between the data line and an adjacent region on an array substrate can be reduced, so that the difference in level in the region covered by polyimide solution can be reduced, and during a rubbing process, the rubbing range of a polyimide solution can be increased, and the risk of light leakage can be reduced without a decrease of the pixel aperture ratio.

In above embodiments, the technical solutions of the present invention have been introduced in an example in which a difference-in-level compensation pattern is formed by a gate metal layer or an active layer. However, the present invention is not limited to forming a difference-in-level compensation pattern by a gate metal layer or an active layer. In the technical solution of the present invention, the difference-in-level compensation pattern may also be formed right above the data line by a transparent conductive layer for the common electrode.

The above description shows some embodiments of the present invention. It should be pointed out that improvements and modifications may also be made by one of ordinary skills in the art without departing from the spirit and scope of the present invention, and these improvements and modifications should be construed as pertaining to the protection scope of the present invention.

What is claimed is:

1. An array substrate, comprising: a substrate, and a first region and a second region that are provided on the substrate and adjacent to each other, wherein a difference in level between the first region and the second region exceeds a threshold, a difference-in-level compensation pattern is provided on the substrate, and the difference-in-level compensation pattern overlaps with both the first region and the second region in a direction perpendicular to the substrate, and the difference-in-level compensation pattern does not exceed the first region and the second region, and the difference-in-level compensation pattern is formed by an active layer.

2. The array substrate according to claim 1, wherein the first region is a region in which a data line is located, and the difference-in-level compensation pattern extends along the data line in a direction parallel to the substrate.

3. The array substrate according to claim 2, wherein the array substrate comprises:
   a substrate;
   a gate electrode and a gate line that are formed by a gate metal layer and provided on the substrate;
   a gate insulating layer provided on the gate electrode and the gate line;
   a pattern of an active layer, the difference-in-level compensation pattern formed by the active layer and a pixel electrode that are provided on the gate insulating layer;
   a source electrode, a drain electrode and the data line that are formed by a source-drain metal layer and provided on the pattern of the active layer and the difference-in-level compensation pattern;
   a passivation layer provided on the pixel electrode, the source electrode, the drain electrode and the data line;
   a common electrode provided on the passivation layer; and
   an orientation layer provided on the common electrode.

4. The array substrate according to claim 1, wherein the array substrate comprises:
   a substrate;
   a gate electrode and a gate line that are formed by a gate metal layer and provided on the substrate;
   a gate insulating layer provided on the gate electrode and the gate line;
   a pattern of an active layer, the difference-in-level compensation pattern formed by the active layer and a pixel electrode that are provided on the gate insulating layer;
   a source electrode, a drain electrode and the data line that are formed by a source-drain metal layer and provided on the pattern of the active layer and the difference-in-level compensation pattern;
   a passivation layer provided on the pixel electrode, the source electrode, the drain electrode and the data line;
   a common electrode provided on the passivation layer; and
   an orientation layer provided on the common electrode.

5. A display device, comprising the array substrate according to claim 1.

6. A method for manufacturing an array substrate, the array substrate comprising a substrate, and a first region and a second region that are provided on the substrate and adjacent to each other, and a difference in level between the first region and the second region exceeds a threshold, the method comprising:
   forming a difference-in-level compensation pattern on the substrate, wherein the difference-in-level compensation pattern overlaps with both the first region and the second region in a direction perpendicular to the substrate, and the difference-in-level compensation pattern does not exceed the first region and the second region;
   wherein forming a difference-in-level compensation pattern on the substrate comprises:
   forming the pattern of an active layer and the difference-in-level compensation pattern by an active layer via a one-time patterning process.

7. The method for manufacturing an array substrate according to claim 6, wherein the first region is a region in which a data line exists, and forming a difference-in-level compensation pattern on the substrate comprises:
   forming the difference-in-level compensation pattern on the substrate, wherein the difference-in-level compensation pattern extends along the data line in a direction parallel to the substrate.

* * * * *